(12) United States Patent
Wang et al.

(10) Patent No.: US 8,907,464 B2
(45) Date of Patent: Dec. 9, 2014

(54) HELIX SUBSTRATE AND THREE-DIMENSIONAL PACKAGE WITH SAME

(71) Applicants: Huan Wang, Tianjin (CN); Meiquan Huang, Tianjin (CN); Hejin Liu, Tianjin (CN)

(72) Inventors: Huan Wang, Tianjin (CN); Meiquan Huang, Tianjin (CN); Hejin Liu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 107 days.

(21) Appl. No.: 13/848,734

(22) Filed: Mar. 22, 2013

(65) Prior Publication Data

US 2014/0146497 A1 May 29, 2014

(30) Foreign Application Priority Data

Nov. 26, 2012 (CN) .......................... 2012 1 0485240

(51) Int. Cl.

| | | |
|---|---|---|
| H01L 23/02 | (2006.01) | |
| H01L 23/04 | (2006.01) | |
| H01L 23/34 | (2006.01) | |
| H01L 23/48 | (2006.01) | |
| H05K 1/18 | (2006.01) | |
| H05K 1/14 | (2006.01) | |
| H05K 3/28 | (2006.01) | |

(52) U.S. Cl.
CPC ............... *H05K 1/181* (2013.01); *H05K 1/141* (2013.01); *H05K 1/144* (2013.01); *H05K 3/284* (2013.01); *H05K 2201/041* (2013.01); *H05K 2201/09027* (2013.01)

USPC ........... 257/686; 257/678; 257/685; 257/698; 257/724; 257/734; 438/107; 438/127; 438/106; 438/124; 438/596

(58) Field of Classification Search
CPC ................... H01L 2924/00; H01L 2924/1815; H01L 2224/32145; H01L 2224/45015; H01L 2224/16145; H01L 2224/48145; H01L 2224/48137; H01L 25/0657; H01L 27/0207; H01L 27/11565; H01L 27/11519; H01L 27/10; H01L 2225/06562; H01L 2225/06568; H01L 23/13; H01L 23/3121; H01L 23/50; H01L 23/528; H01L 23/5385; H01L 23/31; H01L 29/0657; H01L 24/80; H01L 24/90
USPC ......... 257/678, 685, 686, 698, 723, 724, 730, 257/734, E21.499, E21.614, 773, E25.029, 257/E25.013, 690, 692, 676, E25.027, 668, 257/E23.004, E23.145, E23.151, 691, 257/E23.124, E25.006, E27.026, E23.172, 257/E23.003, E23.178, E23.07, E23.085, 257/E23.123, E25.016, E25.021, E31.117, 257/787, E33.056, E33.059, E51.002, 100, 257/684, 687, 689; 438/455, 107, 127, 106, 438/124, 128, 596, 26, 51, 55
See application file for complete search history.

(56) References Cited

U.S. PATENT DOCUMENTS 6,256,203 B1 * 7/2001 Ingraham et al. ............. 361/720

\* cited by examiner

*Primary Examiner* — Julio J Maldonado
*Assistant Examiner* — Cory Eskridge
(74) *Attorney, Agent, or Firm* — Charles Bergere

(57) ABSTRACT

A three dimensional (3D) package includes a helix substrate having a columnar part including a top surface, a bottom surface and a sidewall, and a plurality of steps arranged along the sidewall of the columnar part in the form of a helix. Semiconductor integrated circuits (dies) may be attached on supporting surfaces of the steps. The columnar part, the steps and the dies can be covered with a mold compound. I/Os are formed at either the sides of the steps and/or the top and/or bottom of the columnar part.

8 Claims, 4 Drawing Sheets

HELIX SUBSTRATE AND THREE-DIMENSIONAL PACKAGE WITH SAME

BACKGROUND OF THE INVENTION

The present invention relates to the packaging of semiconductor devices in general and, more specifically, to a helix substrate and a three-dimensional (3D) package having the same.

Recently, with the advances in integrated circuit (IC) technology, 3D package has been developed. 3D packaging involves either stacking two or more dies within a single package, or stacking and connecting completed packages. 3D packages offer significant size reductions compared to existing packages as they pack more circuitry per square centimeter of board space and per cubic centimeter of application space. In light of these and numerous other advantages, 3D packages are capturing an increasing share of the market for IC packages. However, prior 3D packages use stacked dies or comprise stacking and connecting completed packages to combine more functions in one unit. Thus, the number of Input/Output (I/O) contacts for electrical connection between dies in the package and an external device and the number of layers of the stacked-dies are both limited. Therefore, it would be desirable to be able to assemble a 3D package with more I/O contacts and more layers of stacked-dies.

Accordingly, it is an object of the present invention to provide a 3D package having more I/O contacts and more layers of stacked-dies and a method of assembling such a package to solve the above-mentioned short comings of existing 3D packages.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

One embodiment of the present invention provides a helix substrate for a three-dimensional (3D) package. The helix substrate comprises a columnar part and a plurality of steps. The columnar part includes a top surface, a bottom surface and a sidewall. The plurality of steps is arranged along the sidewall of the columnar part in the form of a helix.

Another embodiment of the present invention provides a three-dimensional package. The 3D package comprises a helix substrate having a columnar part including a top surface, a bottom surface and a sidewall; a plurality of steps arranged along the sidewall of the columnar part in the form of a helix, wherein at least one of the steps includes a top supporting surface and a bottom supporting surface. At least one die is bonded on a top supporting surface or a bottom supporting surface of the step, and molding material encapsulates the columnar part, the plurality of steps parts and the at least one die.

According to the invention, the number of dies in the unit space of the package is increased so that the 3D package according to this invention, compared to existing 3D packages, allows for more functions per square centimeter of board space and per cubic centimeter of application space. Furthermore, the number of I/O contacts is also significantly increased.

Figure 1:
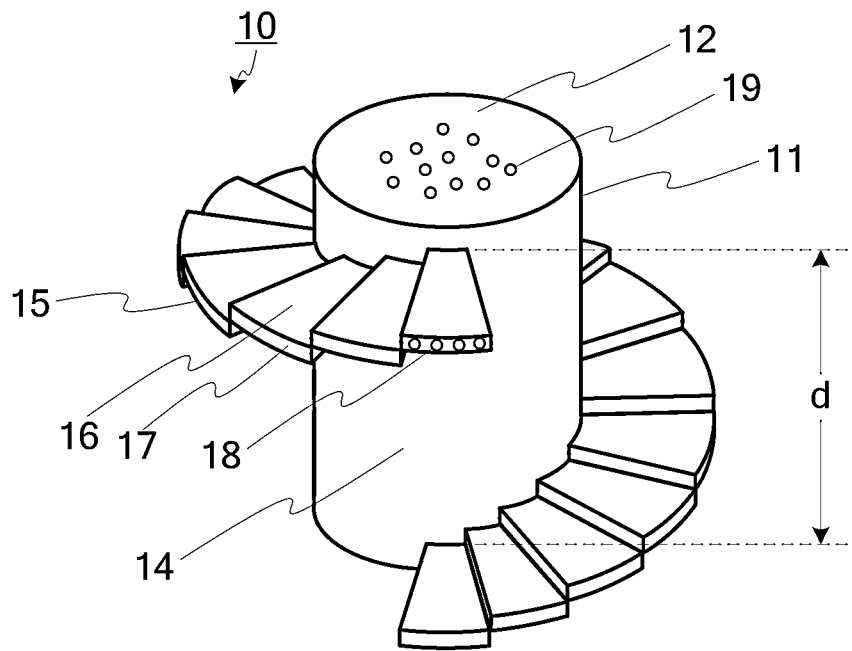
FIG. 1 is a schematic diagram of a helix substrate for a 3D package in accordance with an embodiment of the present invention.

Referring now to FIG. 1, a schematic diagram of a helix substrate 10 for a 3D package in accordance with an embodiment of the present invention is shown. The helix substrate 10 comprises a columnar part 11, which includes a top surface 12, a bottom surface (which is opposite to the top surface 12 and not visible in FIG. 1) and a sidewall 14.

The helix substrate 10 further comprises a plurality of steps 15 arranged along the side wall 14 of the columnar part 11 in the form of a helix. From an aesthetic point of view, the helix substrate 10 looks like a tower with winding stairs on the outside wall. A distance "d" between two overlapping steps represents a thread pitch. FIG. 1 only shows a few of the steps 15. Persons skilled in the art will understand that the number of the steps 15 may vary depending on requirements, such as number of die/chips in the package. Each of the steps 15 extends radially outward with respect to the columnar part 11. In the embodiment shown, each step 15 abuts an adjacent step 15. The steps 15 include a flat, top supporting surface 16 and a flat, bottom supporting surface (which is opposite to the top supporting surface 16 and not visible in FIG. 1) for supporting a semiconductor die.

The step 15 further includes a side surface 17 away from the columnar part 11. In one embodiment, the side surface 17 of a step 15 includes at least one first I/O contact 18 for electrical connection between a die attached to one of the top or bottom surfaces 17 of the step 15 and an external device (not shown). Thus, in one embodiment, a step 15 comprises a substrate having wirings and pads that allow a semiconductor die attached to a surface 17 of the step 15 (substrate) to be connected to the pads using known methods such as wire bonding or flip-chip bumps, with the difference from know substrates being that the external connection pads are on a side surface 17.

In some embodiments, the helix substrate 10 includes at least one second I/O contact 19 on the top surface 12 and/or the bottom surface of the columnar part 11, for electrical connection between the dies and an external device. In such a case, the steps 15 have contacts at a side surface extends from the columnar part 11 so that wires (routes) can interconnect the second I/O contacts 19 and the dies.

The substrate 10 may be organic, ceramic, glass, silicon, or Gallium arsenide, all of which are known to those of skill in the art. The columnar part 11 and the steps 15 are generally made of the same material, and integrated together into one piece. For example, the substrate 10 could be formed layer by layer with the internal circuits embedded at the same time, with the help of a 3D printer or a 3D molding machine. An exemplary helix substrate comprises 10-30 steps 15 circling around the columnar part 11 in 1-3 circles, each step 15 having a radian within the range from $2\pi/20$ to $2\pi/6$. A helix substrate comprising the steps 15 of other quantities and circles is also probable. Each step 15 may have a laminate structure with several layers, as desired.

Figure 2:
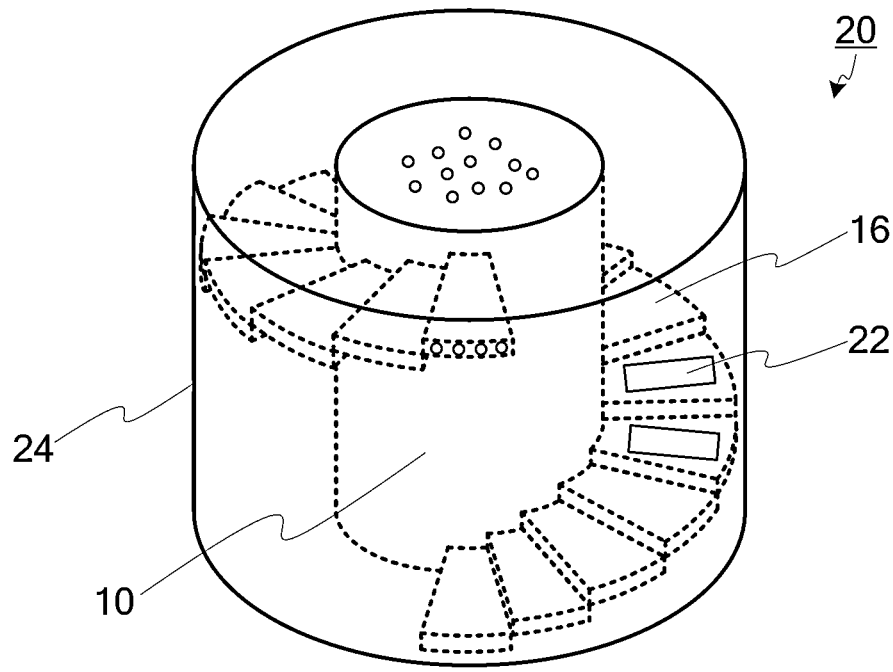
FIG. 2 is a perspective view of a 3D package in accordance with an embodiment of the present invention.

Referring to FIG. 2, a perspective view of a 3D package 20 in accordance with an embodiment of the present invention is shown. The 3D package 20 comprises, in addition to the helix substrate 10 described with reference to FIG. 1, at least one die 22 that is attached or bonded on a step 15 of the substrate 10, and molding compound 24 that encapsulates the helix substrate 10 and the at least one die 22. The at least one die 22 may comprise various types of devices, such as a microcontroller unit (MCU), a System on a Chip (SoC), an application specific IC (ASIC), etc. The molding compound 24 may comprise well known commercially available molding material such as plastic or epoxy. In this example, the 3D package 20 has a cylindrical shape. However, it other embodiments, the 3D package 20 could be formed as other shapes, such as a cube.

Figure 3:
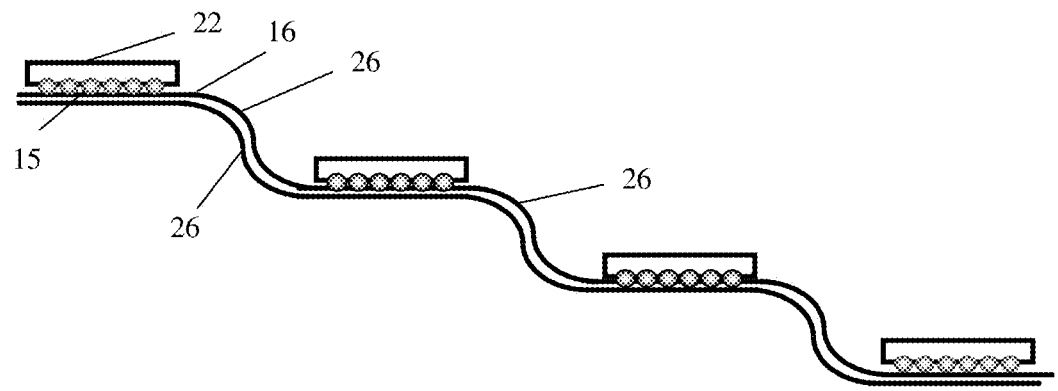
FIG. 3 is a stretch out view of steps of the 3D package in accordance with the embodiment shown in FIG. 2.

FIG. 3 is a stretched-out view of steps of the 3D package in accordance with the embodiment shown in FIG. 2 and illustrates how the dies 22 may be attached to the top supporting surfaces 16 of the steps 15. For example, the dies 22 may be bonded on the top supporting surface 16 of the step 15 by Gold Bump Soldering, Flip-chip attaching, Stud Bump Bonding, or any other suitable means. In this embodiment, at the connection between one step and its adjacent step, each step 15 has a rounded corner 26. That is, the connection between steps 15 has a smooth surface so that the molding compound 24 can flow easily along the steps 15 when the substrate 10 and dies are being encapsulated with the mold compound 24.

As previously discussed, the distance between overlapping steps is termed thread pitch "d". When the thread pitch "d" of the substrate 10 is equal to zero, the package is disk-shaped; that is, a two-dimensional package. Thus, any prior die bond method is available, for example, Pin Grid Array Package (PAG), Stud Bump Array, Wire Bond, Flip Chip, Tape Automated Bonding (TAB), and lead frame. When the thread pitch "d" is significantly greater than a thickness of the die 22, known die bonding methods may be used, such as Flip Chip attaching, but when the thread pitch "d" is relatively small, for example close to the thickness of the die, difficulties may be encountered when using known die bonding methods. Thus an alternative method of attaching a die 22 to a step 15 is described below.

Figure 5:
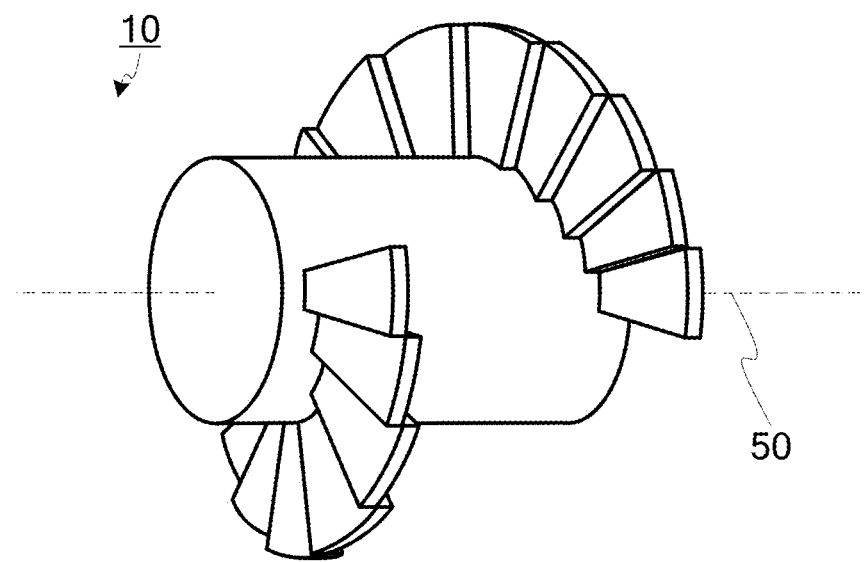
FIG. 5 is a schematic diagram of a helix substrate with its axis extending horizontally.
Figure 4:
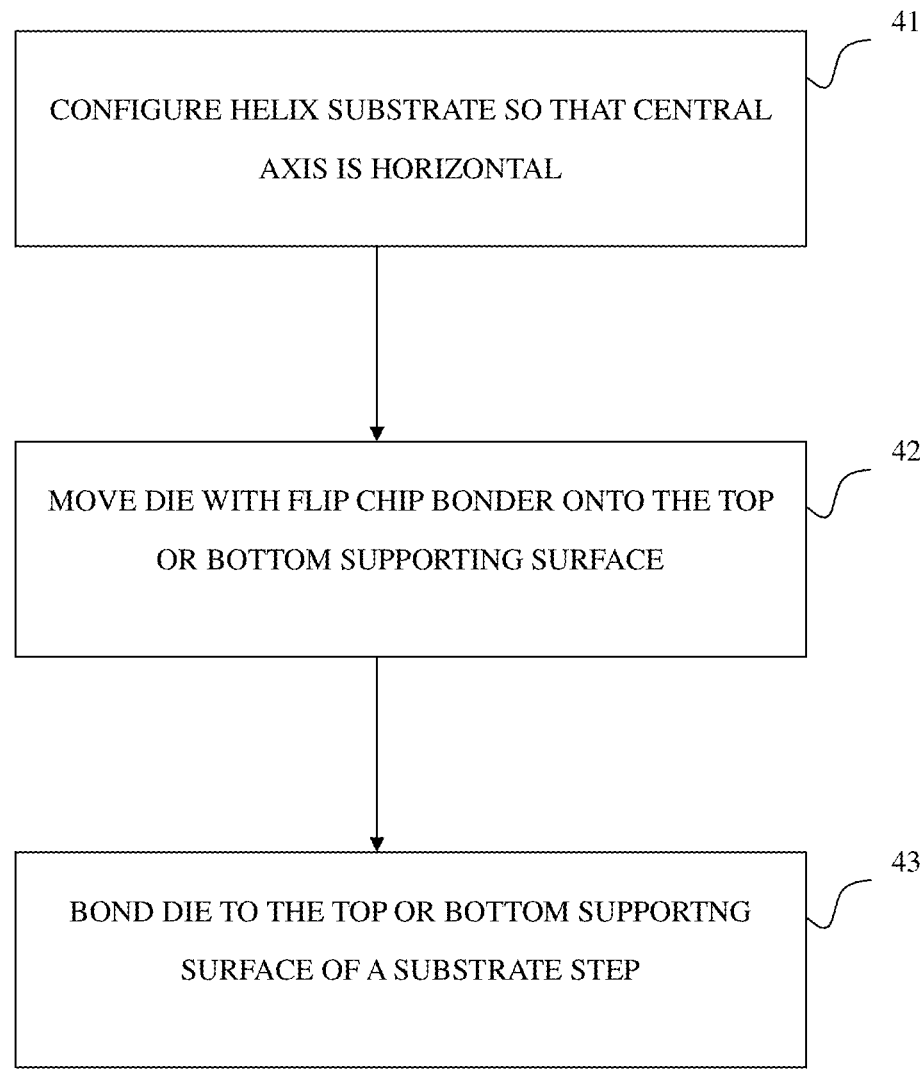
FIG. 4 is a flow chart illustrating a method of assembling a 3D package in accordance with an embodiment of the present invention.
Figure 6A:
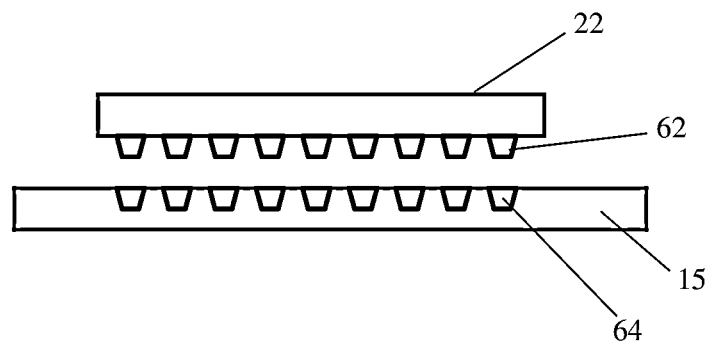
FIG. 6A is a front view illustrating the dies and the steps in accordance with an embodiment of the present invention.
Figure 6B:
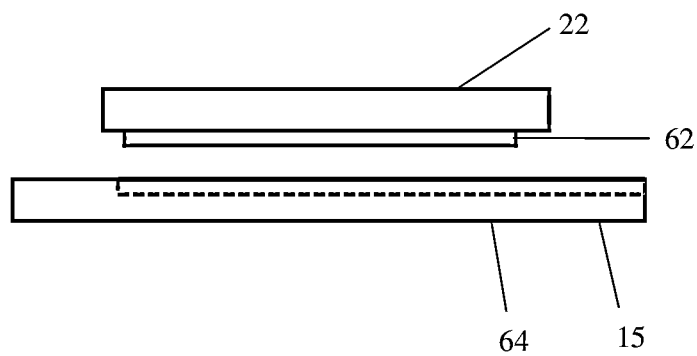
FIG. 6B is a side view illustrating the dies and the steps in accordance with an embodiment of the present invention.
Figure 6C:
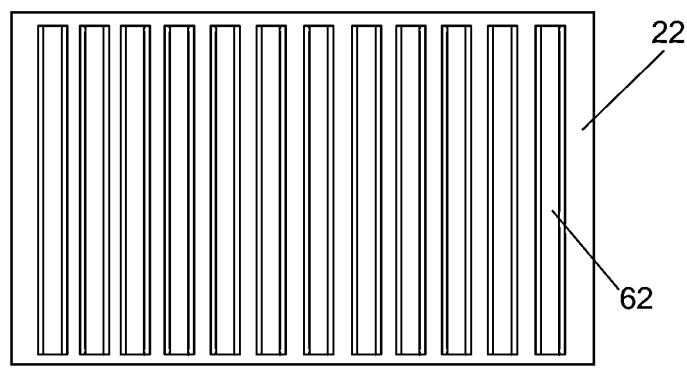
FIG. 6C is a bottom view illustrating the dies in accordance with an embodiment of the present invention.

FIG. 4 is a flow chart illustrating a method of forming a 3D package in accordance with an embodiment of the present invention. FIG. 5 is a schematic diagram of a helix substrate with its axis extending horizontally. FIG. 6A is a front view illustrating a die 22 being attached to a step 15 in accordance with an embodiment of the present invention; FIG. 6B is a side view illustrating the die 22 and the step 15 in accordance with an embodiment of the present invention; and FIG. 6C is a bottom view illustrating one of a plurality of the dies 22 in accordance with an embodiment of the present invention.

Referring now to FIGS. 4-6, at step 41, the helix substrate 10 is configured such that a central axis 50 of the substrate 10 extends horizontally, which is generally the forwarding direction of an assembly line, as shown in FIG. 5.

At step 42, a die 22 is moved vertically by a flip chip bonder (not shown) onto the top or bottom supporting surface supporting surface 16 of the step 15 of the substrate 10.

At step 43, the die is bonded on the top or bottom supporting surface 16 of the step 15 of the substrate 10. As shown in FIGS. 6A-6C, the die 22 includes a plurality of electrode pins 62 on one surface thereof, and the step 15 includes a plurality of grooves 64 on one supporting surface thereof corresponding to the plurality of electrode pins 62 of the die 22. The electrode pins 62 of the die 22 are inserted by the bonder into the corresponding grooves 64 of the step 15 such that the die 22 is bonded on the supporting surface of the step 15.

In one embodiment, each pin 62 is shaped as a column with trapezoid cross section, and each groove 64 has an occlusal cross section relative to a pin 62, such that a die 22 could be bound to a step 15 by either sliding the grooves 64 with the die 22 or sliding the pins 62 of the die 22 into the grooves 64 from a side.

Although the embodiments described above are directed to chip packaging, persons skilled in the art will understand that the structure of the helix substrate also can be applied to other fields such as circuit boards, electrical equipment.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A three-dimensional package, comprising:
   a helix substrate comprising:
     a columnar part including a top surface, a bottom surface and a sidewall; and
     a plurality of steps arranged along the sidewall of the columnar part in the form of a helix, wherein at least one of the steps includes a top supporting surface; and
   at least one semiconductor die attached to the top supporting surface of the at least one step.

2. The three-dimensional package of claim 1, further comprising molding compound encapsulating the helix substrate and the at least one die.

3. The three-dimensional package of claim 1, wherein each of the steps extends radially outward from the columnar part.

4. The three-dimensional package of claim 1, further comprising at least one first I/O contact on at least one of the top surface and bottom surface of the columnar part, wherein the at least one die is electrically connected to the at least one first I/O contact.

5. The three-dimensional package of claim 4, further comprising a conductive path inside the columnar part for electrical connection between the at least one die and the at least one first I/O contact.

6. The three-dimensional package of claim 1, wherein at least one of the steps includes a side surface away from the columnar part.

7. The three-dimensional package of claim 6, further comprising at least one second I/O contact on the side surface, wherein the at least one die is electrically connected to the at least one second I/O contact.

8. The three-dimensional package of claim 7, further comprising a conductive path inside the at least one of the steps for electrically connecting the at least one die and the at least one second I/O contact.

* * * * *